(12) United States Patent
Chen et al.

(10) Patent No.: US 7,105,897 B2
(45) Date of Patent: Sep. 12, 2006

(54) SEMICONDUCTOR STRUCTURE AND METHOD FOR INTEGRATING SOI DEVICES AND BULK DEVICES

(75) Inventors: Hao-Yu Chen, Kaohsiung (TW);
Fu-Liang Yang, Hsin-Chu (TW);
Hung-Wei Chen, Hsinchu (TW);
Ping-Kun Wu, Chang-Hua (TW);
Chao-Hsiung Wang, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/977,236

(22) Filed: Oct. 28, 2004

(65) Prior Publication Data

US 2006/0097316 A1    May 11, 2006

(51) Int. Cl.
H01L 27/01 (2006.01)
H01L 27/12 (2006.01)
H01L 31/0392 (2006.01)

(52) U.S. Cl. .................... 257/347; 257/353; 257/354

(58) Field of Classification Search ........ 257/347–354, 257/507
See application file for complete search history.

(56) References Cited

U.S. PATENT DOCUMENTS 6,635,543 B1    10/2003 Furukawa et al. .......... 438/311
2005/0045951 A1*  3/2005 Yamada et al. ............. 257/350

OTHER PUBLICATIONS

Fenouillet-Beranger, C. et al., "Requirements for ultra-thin film devices and new materials on CMOS Roadmap", 2003 IEEE 0-7803-7815 pp. 145-146, ST Microelectronics, Grenoble, France.

Fukuda, Y. et al., "Special Edition on 21st Century Solutions: SOI-CMOS Device Technology", OKI Technical Review 185, vol. 68 (2001) pp. 54-57.

Koh, R., "Buried Layer Engineering to Reduce the Drain-Induced Barrier Lowering of Sub-0.05 μm SOI-MOSFET", Jpn. J. Appl. Phys., vol. 38 (1999) pp. 2294-2299.

Roche, P., et al., "Comparisons of Soft Error Rate for SRAMs in Commercial SOI and Bulk Below the 130-nm Technology Node", IEEE Transactions on Nuclear Science, vol. 50, No. 6 (2003) pp. 2046-2054.

Fenouillet-Beranger, C. et al., "Requirements for ultra-thin film devices and new materials on CMOS Roadmap", 2003 IEEE O-7803-7815 pp. 145-146.

Mandelman, J.A. et al., "Floating-Body Concerns for SOI Dynamic Random Access Memory (DRAM)", Proceedings 1996 IEEE International SOI Conference, Oct. 1996 IEEE 0-7803-3315-2 pp. 136-137.

Yang, M., "High Performance CMOS Fabricated on Hybrid Substrate With Different Crystal Orientations", 2003 IEEE IEDM 0-7803-7872 pp. 453-456.

Rim, K., et al., "Fabrication and Mobility Characteristics of Ultrathin Strained Si Directly on Insulator (SSDOI) MOSFETs", 2003 IEEE IEDM 0-7803-7872 p. 4952.

* cited by examiner

Primary Examiner—Thien F. Tran
(74) Attorney, Agent, or Firm—Duane Morris LLP

(57) ABSTRACT

This invention discloses a method and a semiconductor structure for integrating at least one bulk device and at least one silicon-on-insulator (SOI) device. The semiconductor structure includes a first substrate having an SOI area and a bulk area, on which the bulk device is formed; an insulation layer formed on the first substrate in the SOI area; and a second substrate, on which the SOI device is formed, stacked on the insulation layer. The surface of the first substrate is not on the substantially same plane as the surface of the second substrate.

20 Claims, 10 Drawing Sheets

SEMICONDUCTOR STRUCTURE AND METHOD FOR INTEGRATING SOI DEVICES AND BULK DEVICES

BACKGROUND

The present invention relates generally to a method of forming semiconductor devices, and more particularly to a simplified method to integrate thin body silicon-on-insulator devices with "bulk" substrate devices.

A key electronic component in the integrated circuit (IC) is the planar, bulk metal-oxide semiconductor field effect transistor (MOSFET). A key driver for the IC industry has been the continuous reduction of the physical dimensions of the MOSFET. In the near future, traditional CMOS technology is expected to reach the limits of scaling. As the MOSFET gate dielectric is scaled down to a thickness of 1.5 nm, the gate leakage current increases sharply. Therefore, non-classical transistor structures will likely be implemented due to their higher performance with lower leakage than the limited conventional scaled CMOS approaches. Unique MOSFET structures such as ultra-thin body (UTB) MOSFETs and double gate MOSFETs offer paths to further scaling in the future. The UTB and double gate MOSFETs can be integrated with silicon-on-insulator ICs. These UTB silicon-on-insulator MOSFETs reduce short channel effects (SCE), increase IC performance and speed, and reduce power consumption. Also, additional design enhancements such as SOI ICs using strained silicon MOSFET technology, as well as dual silicon crystal orientation substrates have started to be implemented to further increase the IC performance.

"Silicon-on-insulator" (SOI) technology utilizes two separate silicon substrates in an IC. The SOI structure is typically comprised of three substrates: a single-crystal silicon layer SOI substrate with a thickness of 1 mm or less; a bulk silicon substrate; and a thin SOI to bulk insulator that electrically isolates the single-crystal layer substrate and the bulk substrate. This thin insulator layer inhibits the parasitic or incidental capacity normally produced between a device and the substrate in conventional wafers. The result is lower power consumption and higher processing speeds.

One method to improve IC performance is to implement UTB MOSFETs on a SOI wafer. In an UTB transistor, leakage current is controlled through the use of the body region, which is significantly thinner than the gate length, where gate lengths may be down to 20 nm in prevalent designs. The potential barrier for any path between the source and drain is more strongly coupled to the gate than the drain. This is accomplished by fabricating the body using a thin silicon film with a thickness approximately one half of the source to drain spacing. When a transistor is constructed with this thin body, the gate potential controls all source-to-drain current paths. As the gate modulates the potential of the channel region, it also modulates the potential of all the other sub-surface leakage paths, thus the UTB transistor does not rely on body doping to provide a potential barrier between its source and its drain. In UTB SOI structures, control of SCE and the adjustments of the threshold voltage (Vt) can be realized with little or no channel doping.

Another method to improve IC performance is to implement double gate MOSFETs on a SOI wafer. Double gate MOSFETs are similar to single gate transistors, except that a second (bottom) gate electrode, which is fully self-aligned to the first (top) gate electrode, is added. The double gate MOSFET has superior control of SCE due to the electrical shielding effects of the bottom gate. It has near ideal sub-threshold slope and mobility enhancement. A double gate MOSFET controls roughly twice as much current as a single gate MOSFET. In addition, the double gate design provides inherent electrostatic and hot carrier coupling in the channel. However, double gate MOSFETs are not commonly implemented because its fabrication is more complex and requires a higher fabrication cost compared to the fabrication of single gate MOSFETs.

Yet another method to improve IC performance is to implement strained silicon MOSFET technologies, which provide high electron mobility by stretching the top silicon layer with an underlying layer of silicon germanium (SiGe). Strained silicon MOSFET incorporation has been proven to provide a 20 to 30 percent performance enhancement. Strained silicon MOSFET technologies can also be implemented on a SOI structure.

Yet another method to improve IC performance is to implement a dual silicon crystal orientation substrate, which is also called a hybrid-orientation substrate. For example, one known implementation, called "Hybrid Orientation Technology", gives a 40 to 65 percent performance enhancement by increasing the mobility of the positive charges, or holes, through the device channels. In that implementation, CMOS ICs consist of positively charged field effect transistors (PFETs) and negatively charged field effect transistors (NFETs). For PFETs, hole mobility is known to be 2.5 times higher on a silicon crystal orientation (110) surface compared to that on a standard silicon crystal orientation (100) surface. Therefore, by incorporating two substrates—a silicon (110) substrate and a silicon (100) substrate—a substantial performance enhancement can be achieved due to higher mobility on the silicon (110) substrate.

Some conventional designs integrate a SOI substrate with a Bulk substrate within an IC, which may also incorporate other implementations such as UTB MOSFETs, double gate MOSFETs, strained silicon MOSFETs, and a hybrid-orientation substrate. By utilizing these implementations, IC performance can be enhanced with allowances for future scaling. Although conventional designs permit the fabrication of an IC with the above structures, they are complex and very costly to implement.

Therefore, desirable in the art of SOI/Bulk structure semiconductor fabrication are improved structures that simplify the fabrication processes, thereby reducing fabrication costs and maintaining allowances for future scaling.

SUMMARY

This invention discloses a method and a semiconductor structure for integrating at least one bulk device and at least one silicon-on-insulator (SOI) device. In an embodiment, the semiconductor structure includes a first substrate having an SOI area and a bulk area, on which the bulk device is formed; an insulation layer formed on the first substrate in the SOI area; and a second substrate, on which the SOI device is formed, stacked on the insulation layer. The surface of the first substrate is not on the substantially same plane as the surface of the second substrate.

The construction and method of operation of the invention, however, together with additional objects and advantages thereof will be best understood from the following description of specific embodiments when read in connection with the accompanying drawings.

DESCRIPTION

According to conventional semiconductor fabrication methods an insulation layer is formed on a bulk semiconductor substrate, and separates an SOI semiconductor substrate from the same. A hard mask layer may be deposited over the SOI semiconductor substrate, which, later on, would protect the SOI semiconductor substrate from exposure In an epitaxial growth process.

The semiconductor structure may include an epitaxial semiconductor layer grown out of a trench, whose side walls are lined with spacers. Such semiconductor structure is constructed by having several process steps performed on the structure. A photolithography process is followed by an etching step to form the trench through the hard mask layer, the SOI semiconductor substrate, the insulation layer, and into the bulk semiconductor substrate. Process steps of chemical vapor deposition and anisotropic etching are performed to form spacers on the side walls of the trench. Thereafter, an epitaxial semiconductor layer is grown in, and extending out of the trench.

Since the hard mask layer is no longer needed in subsequent process steps, and the part of the epitaxial semiconductor layer exceeding the trench roughens the structural surface, a chemical mechanical polishing step is performed to remove the hard mask layer and planarize the structural surface. Thereafter, several conventional process steps follow to form an SOI device on the remaining SOI semiconductor substrate, and a bulk device on the polished epitaxial semiconductor layer.

The epitaxial growth of semiconductor and chemical mechanical polishing are necessary process steps for construction of the SOI/Bulk integrated semiconductor structure, in accordance with the conventional art. The insulation layer has a thickness usually exceeding 1000 Angstroms. This substantially elevates the SOI semiconductor substrate, a ground on which the SOI device can be built. The elevated SOI semiconductor substrate creates a substantial level difference from the bulk semiconductor substrate. Due to level coverage issues, the integration of the SOI device and the bulk devices becomes very difficult, were the bulk device to be built directly on the bulk semiconductor substrate.

The conventional art uses the epitaxial semiconductor layer to create a substantially level top surface as opposed to that of the SOI semiconductor substrate However this unavoidably complicates the fabrication process, incurs a thermal budget for the epitaxial growth, and, therefore, increases fabrication costs.

The present invention discloses an improved semiconductor structure and method that simplifies the conventional process for fabricating an SOI/Bulk integrated semiconductor structure. Various techniques, such as double gate, strained substrate, and hybrid orientation substrate, can be implemented in the disclosed structure and method. As a result, a less costly fabrication process for SOI/Bulk integrated structure is realized.

Figure 1:
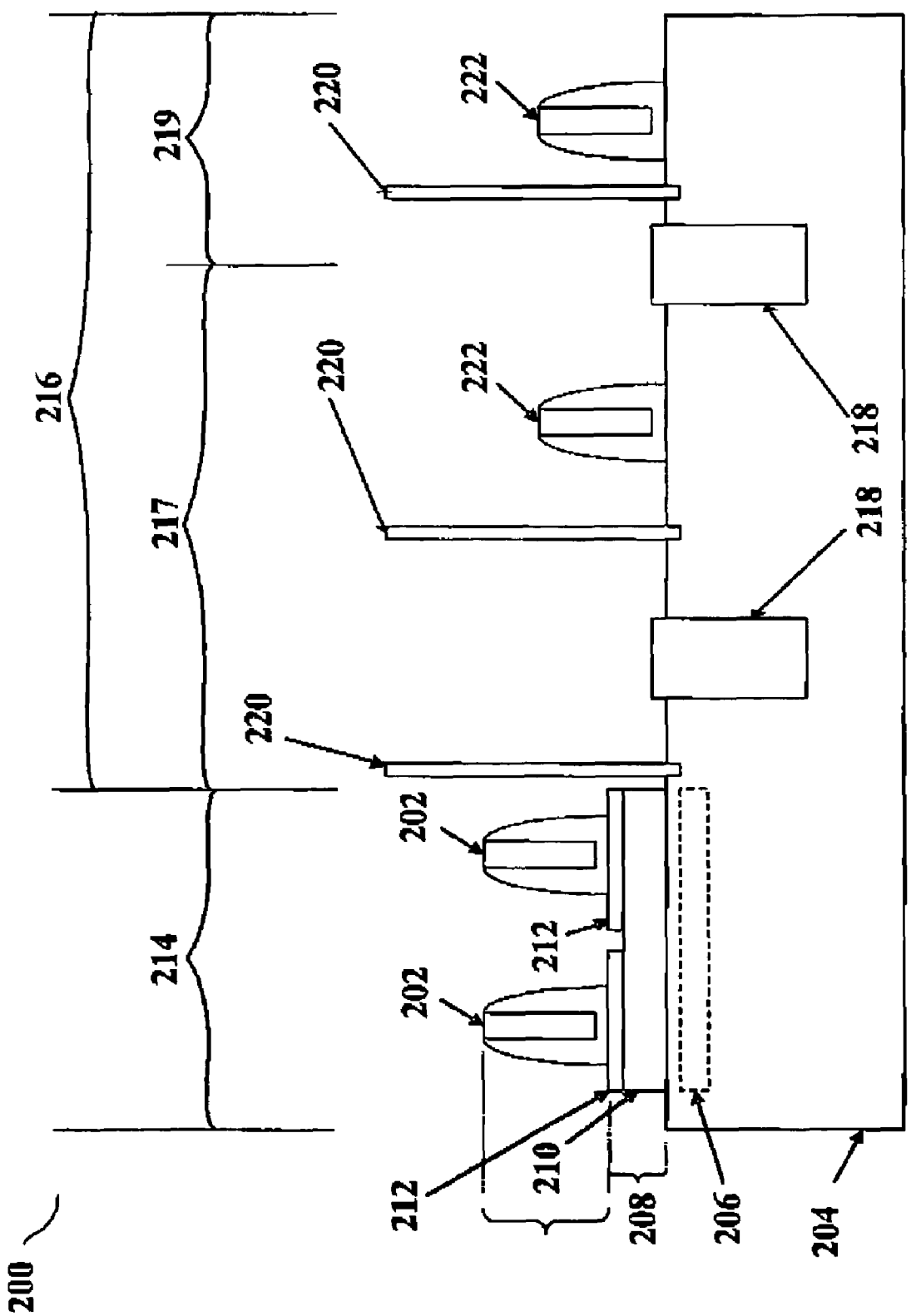
FIG. 1 illustrates a new SOI/Bulk integrated structure, in accordance with one embodiment of the present invention.

FIG. 1. presents a cross section 200 of a new SOI/Bulk semiconductor structure, in accordance with one embodiment of the present invention. This structure includes one or more thin body SOI MOSFETs 202 into a bulk substrate 204. It is noteworthy that in this embodiment, the thin body SOI MOSFETs 202 are strained silicon MOSFETs. Alternatively, standard UTB MOSFETs, or double gate MOSFETs may be integrated onto the SOI substrate as well. The double gate MOSFET may also be implemented on the SOI structure with a second gate 206 located below a barrier oxide layer 208 in the bulk substrate 204. A SOI structure 210 is composed of the thin barrier oxide layer 208 and a strained SOI substrate 212. The SOI MOSFETs 202 are formed on the strained SOI substrate 212. A SOI substrate area 214 is electrically isolated from a bulk substrate area 216 by a shallow trench isolation (STI) structure 218 and the SOI structure 210. The STI structure 218 also isolates an area 217, where analog and bipolar devices may be located, from an area 219, where I/O and ESD devices may be located. Substrate connections 220 provide the electrical connections between IC layers. The bulk substrate area 216 contains MOSFETs 222 for various analog, bipolar, input/output, and ESD circuitries.

In this embodiment, the barrier oxide layer 208 is very thin, compared to the thick barrier oxide layer created in the conventional fabrication process. The above-described conventional buried oxide layer has a thickness over 1000 Angstroms, This inevitably leads to complicated fabrication process steps, including epitaxial growth of silicon and chemical mechanical polishing. In this embodiment, the buried oxide layer 208 has a thickness smaller than 300 Angstroms. While this still elevates the SOI substrate 212, and renders the top surface of SOI substrate 212 not on the substantially same plane as that of the bulk substrate 204, the level difference therebetween is acceptable, and no serious level coverage issue is created. In this embodiment, the level difference is about 350 Angstroms. Practically, a level difference less than 500 Angstroms is deemed acceptable.

While this embodiment is specifically directed to certain material compositions, and dimensions, the invention can be more generally and broadly implemented; for example, the bulk substrate 204 and the SOI substrate 212 can be made of materials, such as SI, Ge, and SiGeC alloys. The buried oxide layer 208 can be made of any kind of insulation materials, such as silicon oxide and silicon nitride. The STI 218 can also be any isolation structure, such as local oxidation of silicon (LOCOS). In addition to MOSFETs, other devices may be formed in the SOI substrate area 214 and the bulk substrate area 216.

FIGs. 2A through 2I show a series of process steps for fabricating the new SOI/Bulk integrated structure, in accordance with one embodiment of the present invention. This fabrication process encompasses the actual SOI substrate fabrication and integration with the bulk substrate.

Figure 2A:
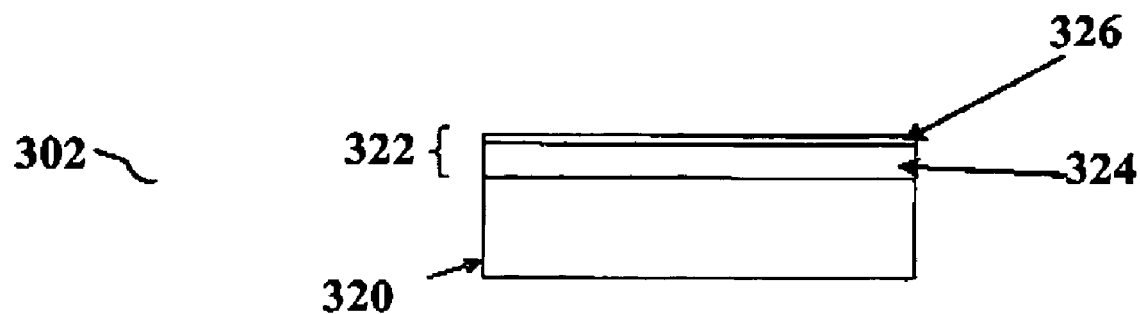
FIGS. 2A through 2I illustrate a process for construction of the new SOI/Bulk integrated semiconductor structure, in accordance with another embodiment of the present invention.

With reference to FIGS. 2A through 2I, this fabrication process includes process steps 302 to 318. It is understood that these steps do not describe the post-transistor fabrication steps or interconnect fabrication steps that are necessary to complete an IC fabrication. In FIG. 2A, the process step 302 starts with a bulk semiconductor substrate 320, on top of which a SOI layer 322 is applied. The SOI layer 322 may be formed by any method known to those skilled in the art. For example, the SOI layer 322 may be formed using a Separation by IMplantation of OXygen (SIMOX) method or a bonded silicon method. With the SIMOX method, oxygen is implanted into the bulk semiconductor substrate 320, followed by the implanted oxygen reacting under elevated temperature with material of the bulk semiconductor substrate 320 to form an oxide layer 324. For example, the oxide layer 324 may be silicon dioxide if the bulk semiconductor substrate 320 includes silicon. An unreacted portion of the bulk semiconductor substrate 320 remains above the oxide 324 and is depicted in FIG. 2A as an SOI substrate 326. The bonded silicon method grows a thermal oxide on a top portion of the bulk semiconductor substrate 320, followed by bonding a thin silicon surface substrate to the oxide layer 324 such that the thin silicon surface substrate becomes the SOI substrate 326.

Figure 2B:
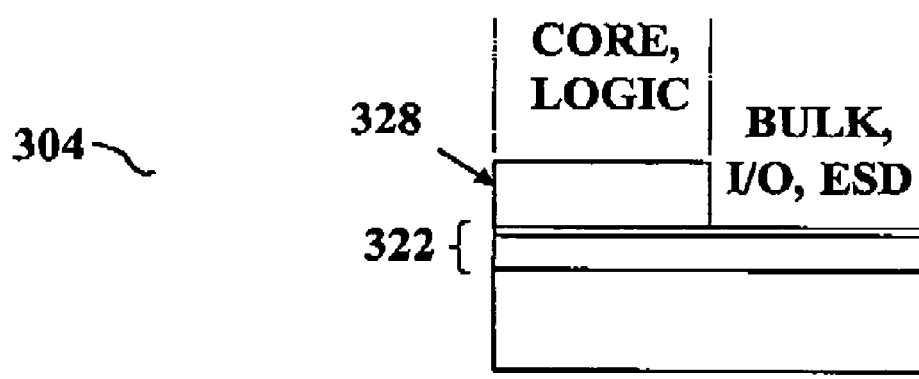

In FIG. 2B, the process step 304 consists of forming a photoresist pattern 328 applied to a SOI portion of the structure to prevent the removal of a portion (e.g. core, logic) of the SOI layer 322 in the process step 306.

Figure 2C:
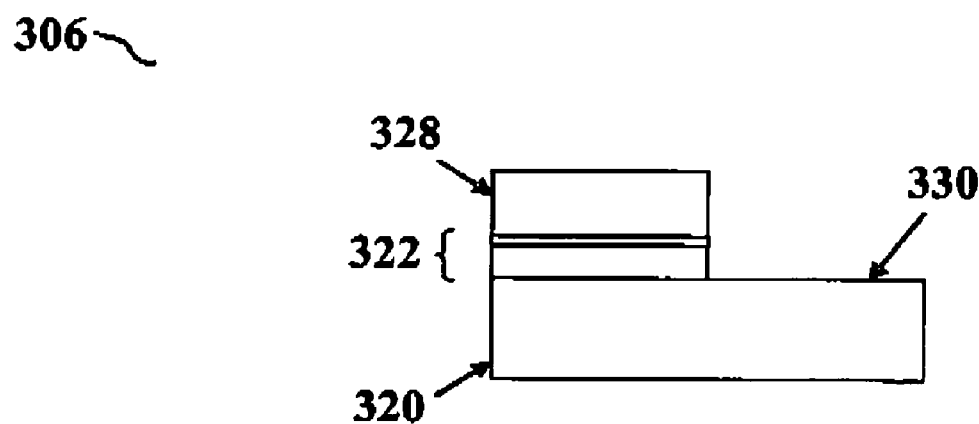

In FIG. 2C, the process step 306 removes a portion 330 of the SOI layer 322 not covered by the photoresist pattern 328. This step uncovers the bulk semiconductor substrate 320 for later bulk transistor integration.

Figure 2D:
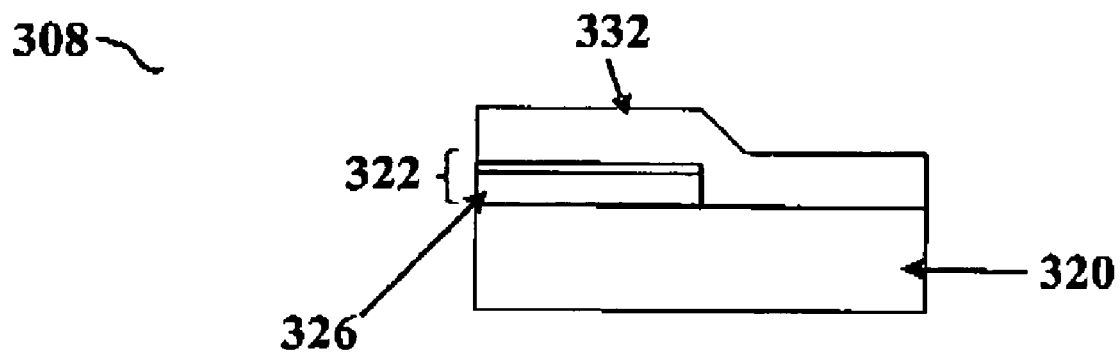

In FIG. 2D, the process step 308 starts with the removal of the photoresist material. It is noteworthy that the top surface of the SOI layer 322 is only one step height above the bulk semiconductor substrate 320. A hard mask layer 332 acting as a surface hard mask is added over the entire surface of the wafer (both the SOI substrate 326 and a portion of the bulk substrate layer 320). The hard mask layer 332. which may be made of SiN, may have a thickness varying from 10 to 510 nm.

Figure 2E:
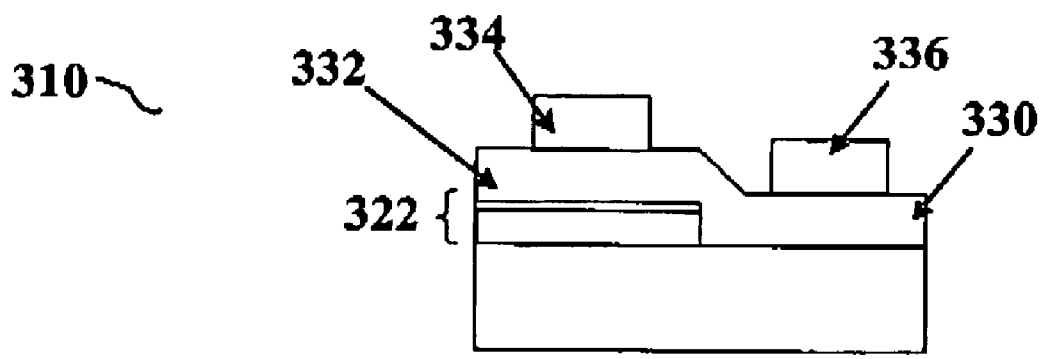

In FIG. 2E, the process step 310 applies a photoresist pattern 334 on the SOI portion (shown earlier in FIG. 2B) of the hard mask layer 332. The size of the photoresist pattern 334 is dependant upon the required active area for the SOI cell. It is understood that the size of this SOI portion may be easily changed by varying the size of the photoresist pattern 334. It is also understood that a photoresist pattern 336 is applied to the bulk portion (shown earlier in FIG. 2B ) to protect the defined active area of the bulk substrate from subsequent etching processes in the process step 312. The open active area ratio of the SOI portion to the bulk portion varies within the range of 1:5 to 1:2.

Figure 2F:
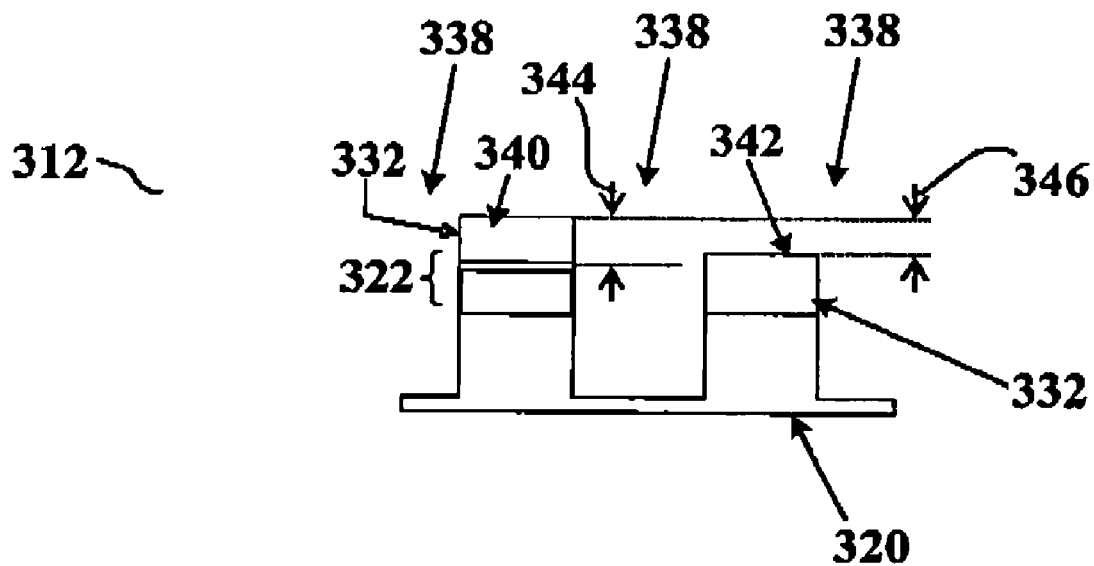

In FIG. 2F, the process step 312 performs an anisotropical etching of the SOI layer 322 and the bulk semiconductor substrate 320 to form various shallow trench isolation (STI) structures 338 to isolate a remaining SOI structure 340 from a remaining bulk semiconductor structure 342. The photoresist patterns 334 and 336 in the process step 310 are then dissolved by a UV light, leaving some part of the hard mask layer 332 on the remaining SOI structure 340 and the remaining bulk semiconductor structure 342. Unlike the conventional process described above the new fabrication process has no epitaxy or chemical mechanical polishing (CMP) processes before the active area definition. The hard mask layer 332 on the remaining SOI structure 340 has approximately a thickness of 800 Angstroms, as depicted by a width 344, while the hard mask layer 332 on the remaining bulk semiconductor structure 342 has approximately a thickness of 350 Angstroms, as depicted by a width 346.

Figure 2G:
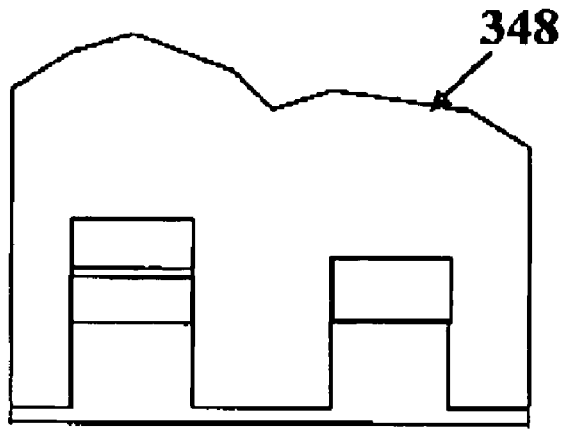

In FIG. 2G, the process step 314 applies an oxide layer 348 on top of the IC structure developed in the process step 312 by using a high density plasma (HDP) technique. The HDP technique is widely employed for inter-layer dielectrics and filling STI structures because of its excellent gap filling capability.

Figure 2H:
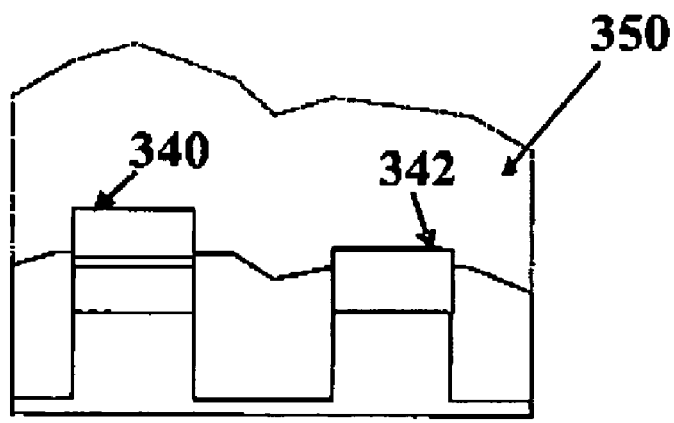

In FIG. 2H, the process step 316 etches away a portion 350 of the oxide layer down to a level that exposes the structures 340 and 342.

Figure 2I:
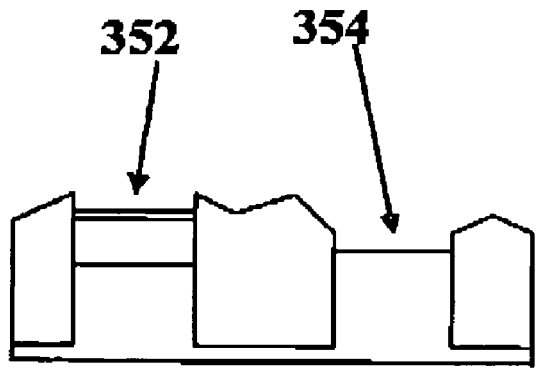

In FIG. 2I, the process step 318 removes the structures 340 and 342 to expose a remaining SOI substrate 352 and a remaining bulk semiconductor substrate 354. As a final step for this layer, an etch stop film is applied over this layer to prevent subsequent etch processes on other layers from affecting this layer. After this paint in the device fabrication, it is understood by those skilled in the art that conventional processes are applied. For example, such conventional processes include: well implant gate insulator growth, electrode deposition, gate definition, source/drain implant, spacer formation, silicidation, contact, and backend interconnect flow.

The new fabrication process flow simplifies the process steps and the processes required to integrate the SOI and Bulk substrates when compared to the previously discussed conventional fabrication processes. No complicated epitaxy or CMP processes are required. The new fabrication process flow results in lower fabrication costs with increased IC performance by utilizing the performance advantages of the SOI and Bulk devices. Also, UTB MOSFETs, double gate MOSFETs, strained silicon MOSFETs, and the dual silicon crystal orientation hybrid substrate technology can be incorparated into the ICs created by this new process to provide both increased IC performance and allowances for future scaling. Other transistor structures not discussed, such as FinFET, Trigate, or FinFET on bulk may be implemented as well. The use of the oxide 324, which is a thin barrier oxide layer, greatly reduces the short channel effects of MOSFET devices with smaller geometries. It is also understood that since the thermal conductivity of the SOI structure is increased, the probability of a thermal run-away is greatly reduced. The IC created by the new processes presented results in a high density, low power, high performance integrated circuit at a lower fabrication cost.

Figure 3A:
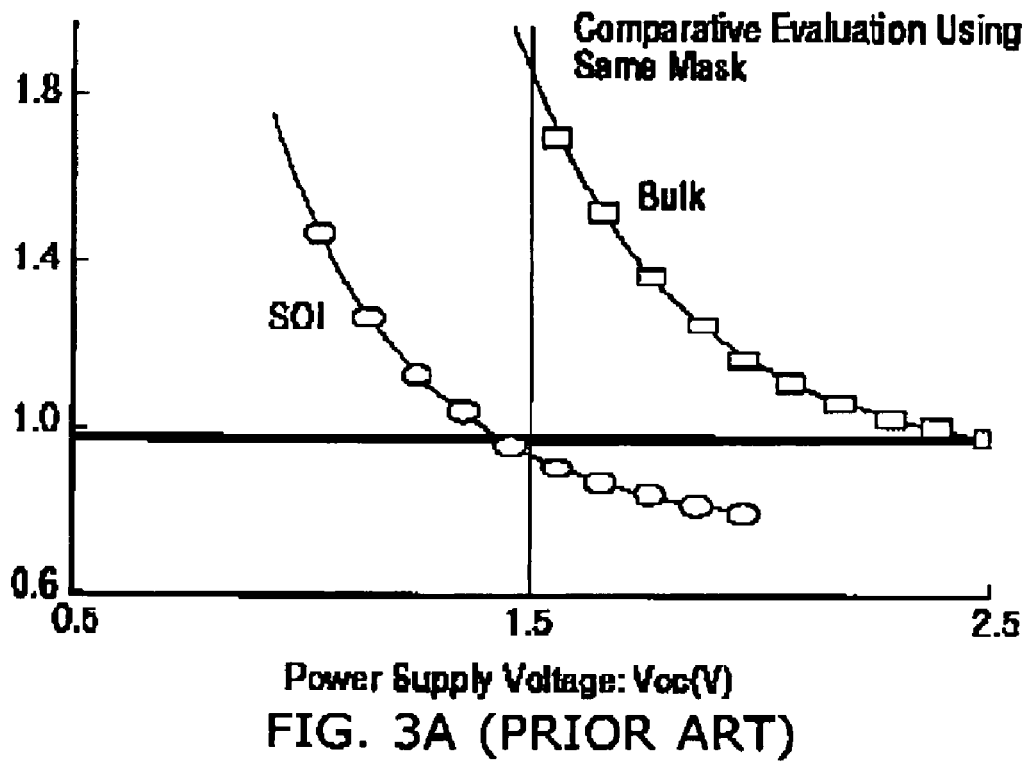
FIGS. 3A through 3B present two performance-related graphs comparing SOI and Bulk devices in the prior art.

FIG. 3A shows experiment results comparing the power supply of the minimum operating cycle time for a processor manufactured using the SOI technology and that of a bulk equivalent device in the prior art. Compared to bulk devices, the SOI devices can operate at a reduced power supply voltage, while maintaining operation performance. This can greedy reduce the power consumption.

Figure 3B:
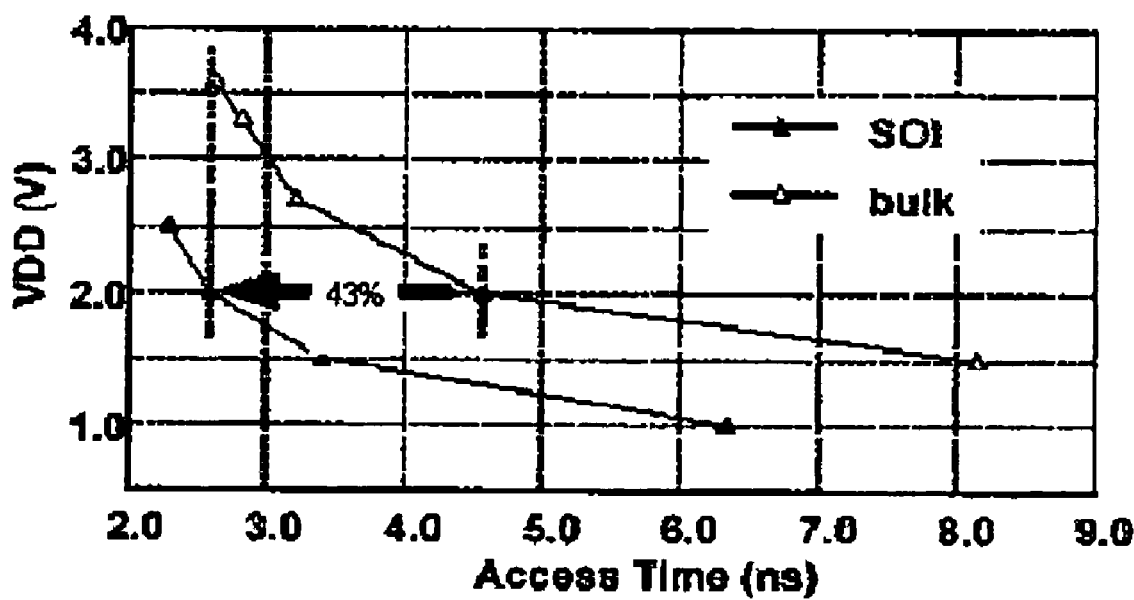

FIG. 3B shows experiment results comparing SRAM access time in SOI and bulk structures in the prior art. In this example, the access times for 1.5 K bit 2-port SRAMs in both SOI and the bulk structures are compared. From the graph 402, it can be seen that for a VDD of 2.0V, the SRAM in the bulk structure has an access time of approximately 4.6 ns, while the SRAM in the SOI structure has an access time of approximately 2.6 ns. This can be attributed to the lower inherent parasitic capacitance in the SOI structure.

Figure 4:
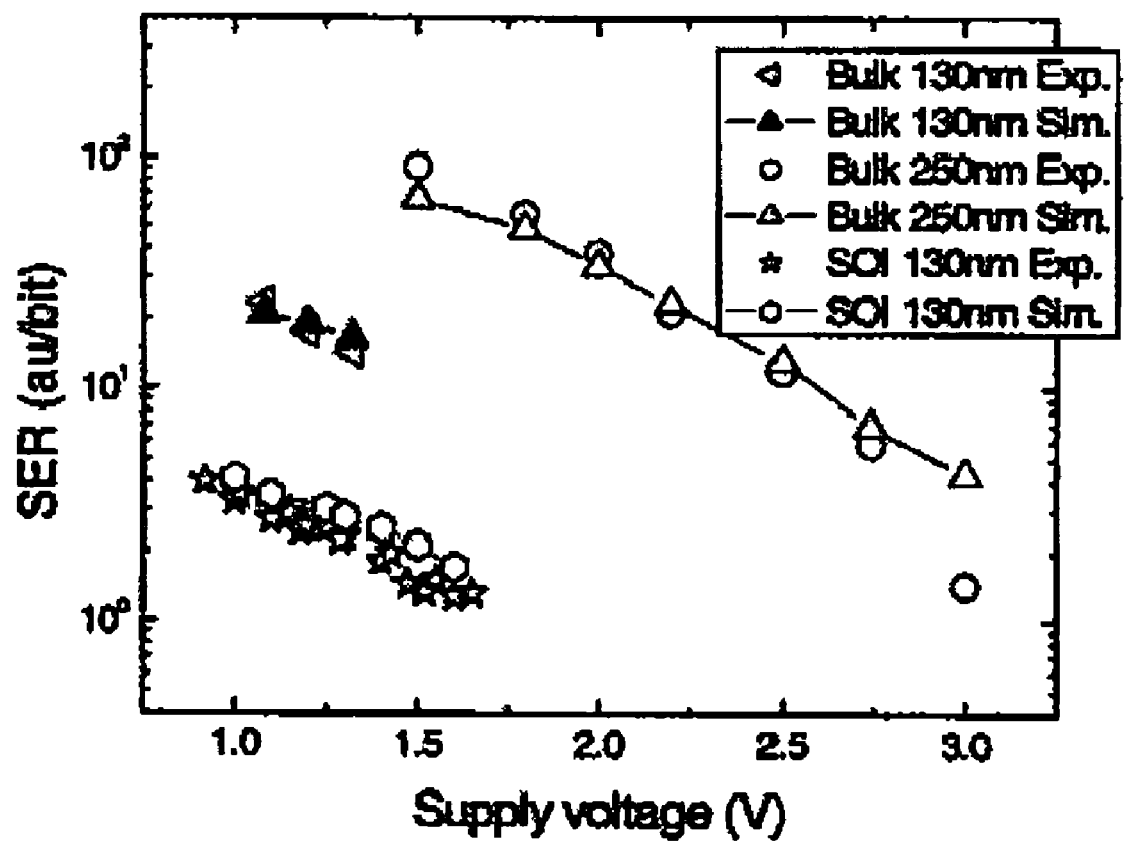
FIG. 4 presents another performance-related graph comparing SOI and Bulk devices in the prior art.

FIG. 4 shows experiment and simulation results comparing the soft error rates (SER) for bulk devices and SOI devices in the prior art. It can be seen that. at the same supply voltage V, the SOI devices have lower SER's.

Figure 5A:
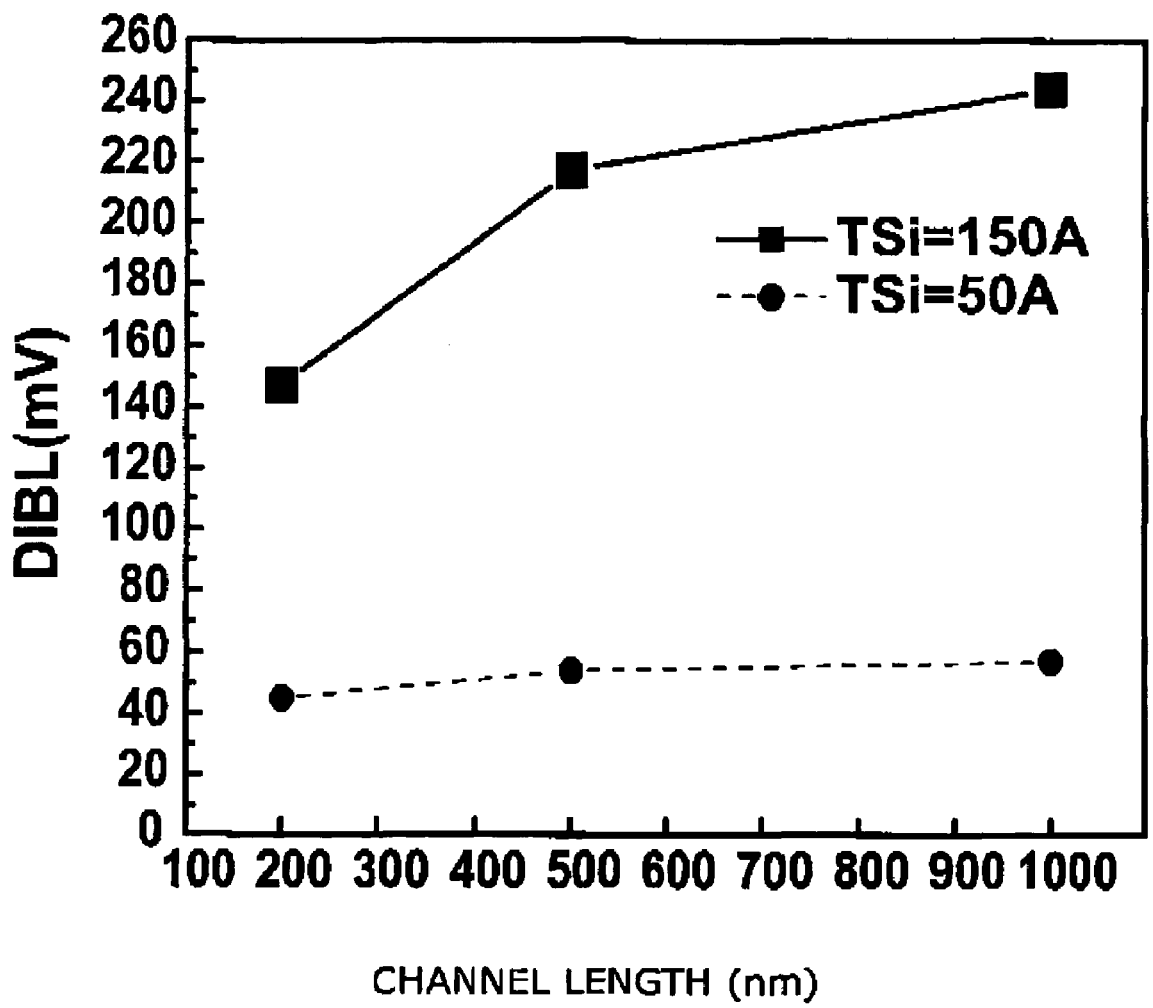
FIG. 5A presents a graph of UTBO DIBL characteristics for silicon thickness variations, in accordance with one embodiment of the present invention.

FIG. 5A presents a graph of ultra thin barrier oxide layer (UTBO) characteristics for various silicon thickness variations. The quality of a short channel transistor design can be assessed by the drain induced barrier lowering (DIBL). DIBL is defined as the change in threshold voltage per volt of change in drain bias. DIBL is defined as a positive number. By increasing the drain voltage, the threshold voltage is lowered. The drain field modulates the source to channel potential barrier via coupling through the silicon substrate. In this graph, it is shown that for a fixed channel length of 50 nm, a 150 Angstrom thick silicon layer would have a DIBL of approximately 220, while a 50 Angstrom thick silicon layer would be approximately 55. This lower DIBL number for 50 A layer indicates that drain voltage changes have less effect on the threshold voltage. The DIBL will further decrease if the buried oxide thickness reduces, which exhibits superior short channel effect suppression characteristics for thin buried oxide SOI devices.

Figure 5B:
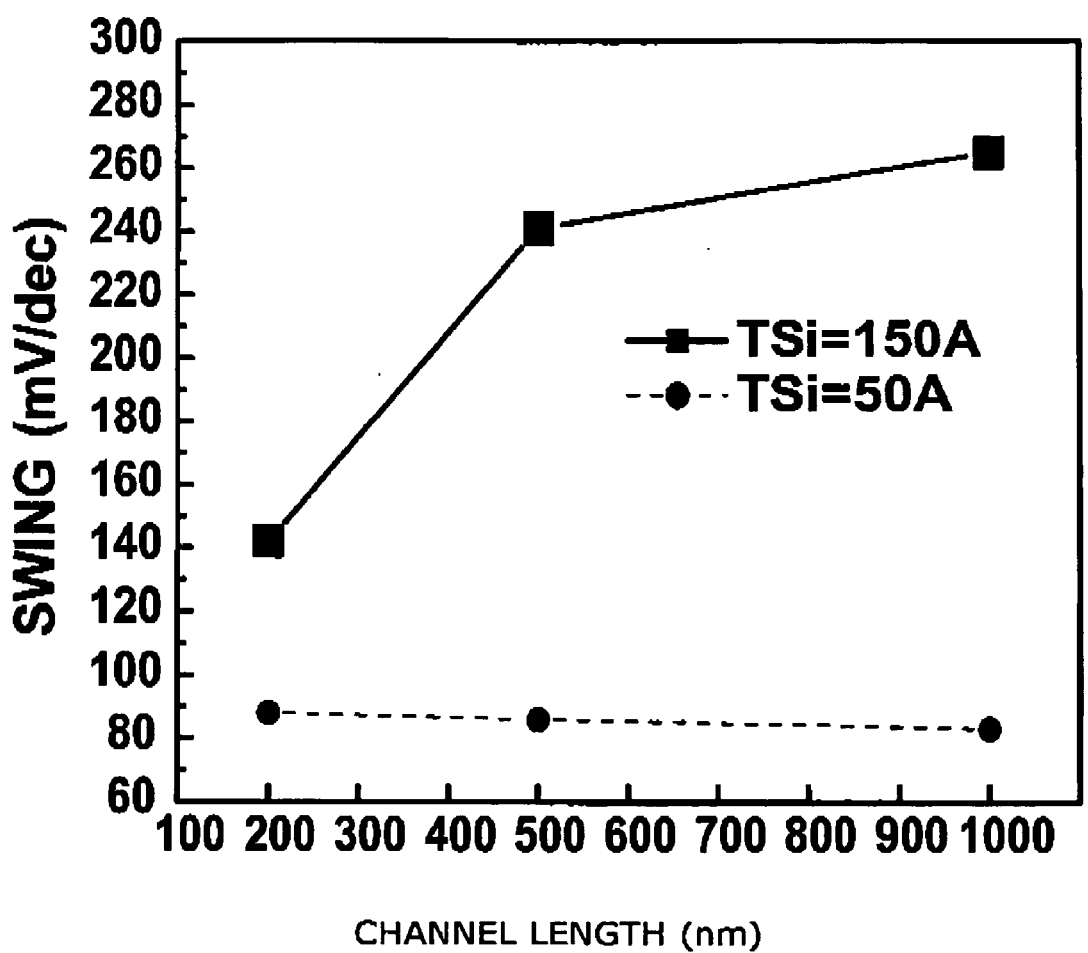
FIG. 5B presents a graph of UTBO sub-threshold voltage swing variations for silicon thickness variations, in accordance with one embodiment of the present invention.

FIG. 5B presents a graph of the ultra thin barrier oxide layer (UTBO) sub-threshold voltage swing for various silicon thickness variations. The definition of the threshold voltage is the gate voltage needed to produce a specific drain current. A measure of the quality of a transistor is the subthreshold swing S, in mV per decade. Below the threshold, the drain current varies exponentially with the gate voltage. The subthreshold swing S is defined as the change, in mV, in gate voltage that results in a ten-fold change in drain current. It is shown in this example that the swing S for a silicon thickness of 150 A with a channel length of 500 nm is approximately 240 mV/decade, while the 50 A thick silicon is approximately 85 mV/decade. Therefore, the 50 A thick silicon has less change of the drain current because of changes in the subthreshold voltage S. The subthreshold swing S will further decrease if the buried oxide thickness reduces, which exhibits superior short channel effect suppression characteristics for thin buried oxide SOI devices.

Figure 5C:
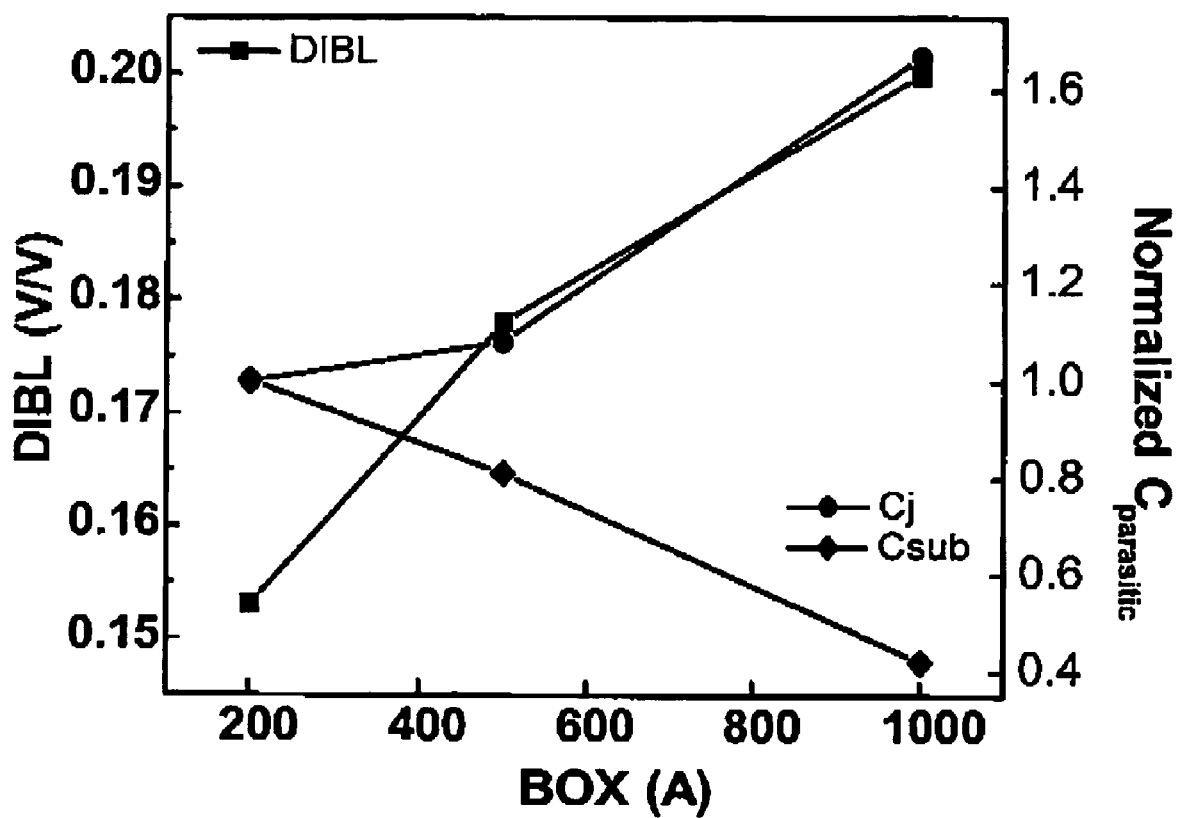
FIG. 5C presents a graph showing the variations of the junction capacitance and the substrate capacitance with respect to the variation of DILB, in accordance with one embodiment of the present invention.

Referring to FIG. 5C, the smaller DIBL provides more design space for ultra-thin buried oxide SOI devices. Because the DIBL can be suppressed by the thin buried oxide layer, it is not necessary to increase the pocket implant dosage to avoid the drain side depletion region extended into the channel. The junction capacitance can be reduced to compensate the increased substrate capacitance. Thus, the total parasitic capacitance will not increase hence the intrinsic device gate delay will not degrade even using the thin buried oxide SOI.

Figure 5D:
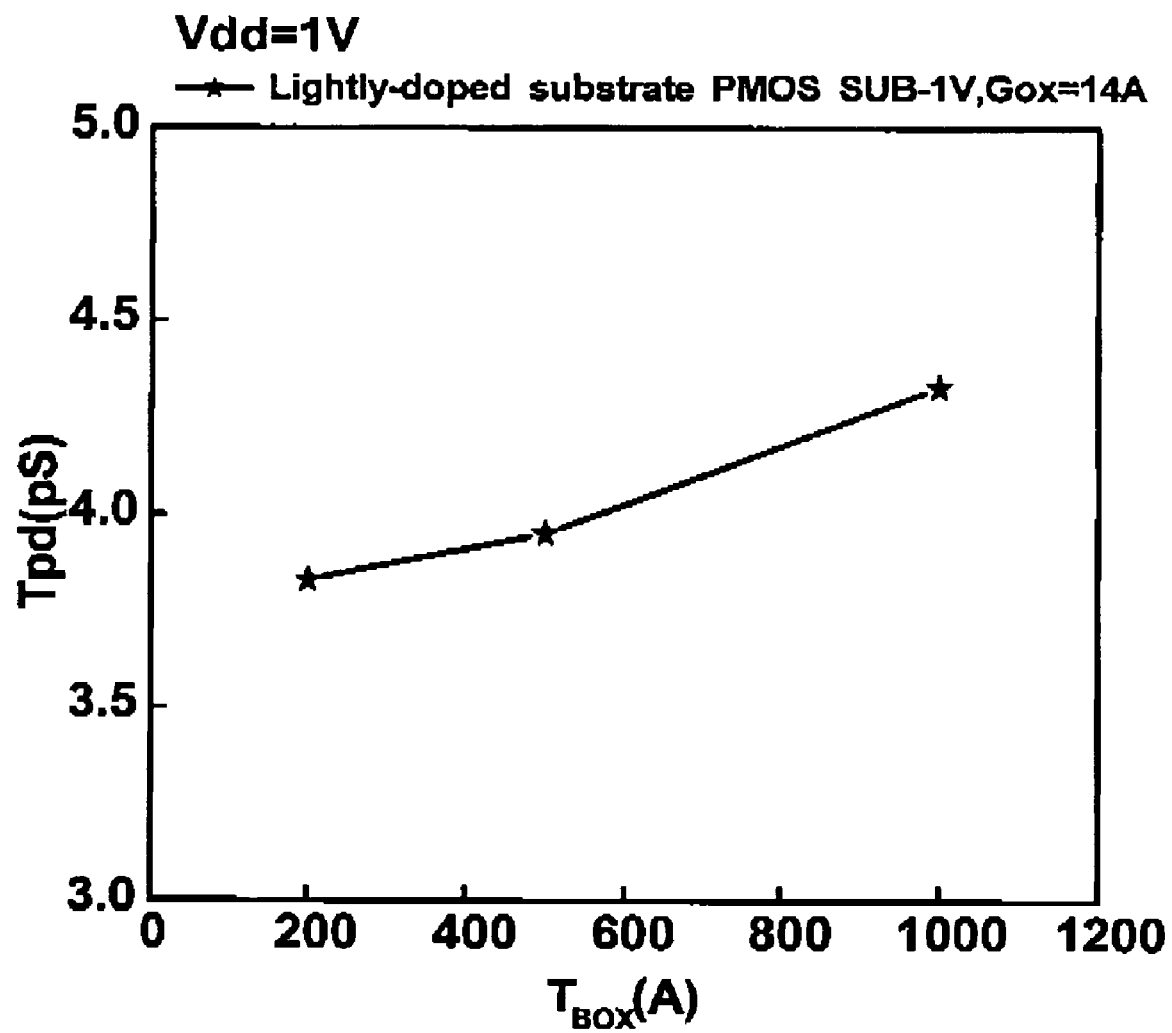
FIG. 5D presents a ring oscillator simulation result that shows the speed benefit of ultra-thin buried oxide SOI, in accordance with one-embodiment of the present invention.

FIG. 5D illustrates a ring oscillator simulation result that shows the speed benefit of ultra-thin buried oxide SOI. Because of the better short channel control ability and lower DIBL, the saturation current can be effectively increased with lower threshold voltage but won't have high off current. This improves the circuit speed.

The above illustration provides many different embodiments or embodiments for implementing different features of the invention. Specific. embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor structure that integrates at least one bulk device and at least one silicon-on-insulator (SOI) device, the semiconductor structure comprising:
    a first substrate having an SOI area and a bulk area, on which the bulk device is formed;
    an insulation layer formed on the SOI area;
    a buried gate under the insulation layer in the first substrate; and
    a second substrate, on which the SOI device is formed, disposed on the insulation layer,
    wherein a surface of the first substrate is not on the substantially same plane as a surface of the second substrate.

2. The semiconductor structure of claim 1 wherein the insulation layer has 8 thickness smaller than 300 Angstroms.

3. The semiconductor structure of claim 1 wherein the surface of the first substrate and the surface of the second substrate have a level difference smaller than 500 Angstroms.

4. The semiconductor structure of claim 3 wherein the level difference is about 350 Angstroms.

5. The semiconductor structure of claim 1 wherein the second substrate has a thickness smaller than 200 nm.

6. The semiconductor structure of claim 1 wherein a width ratio of the SOI area to the bulk area ranges from 1:5 to 1:2.

7. The semiconductor structure of claim 1 wherein the second substrate is a strained substrate.

8. The semiconductor structure of claim 1 wherein the insulation layer is a silicon-oxide-based material.

9. The semiconductor structure of claim 1 wherein the second substrate is made of a material based on Si,Ge or SiGeC alloy.

10. The semiconductor structure of claim 1 further comprising an isolation region on the first substrate for separating the SOI area from the bulk area.

11. A semiconductor structure that integrates at least one bulk device and at least one silicon-insulator (SOI) device, the semiconductor structure comprising:
    a first substrate having an SOI area and a bulk area, on which the bulk device is formed;
    an insulation layer formed on the first substrate in the SOI area; and
    a second substrate, on which the SOI device is formed, being stacked on the insulation layer,
    wherein a top surface of the first substrate and a top surface of the second substrate has a level difference smaller than 500 Angstroms.

12. The semiconductor structure of claim 11 wherein the insulation layer has a thickness smaller than 300 Angstroms.

13. The semiconductor structure of claim 11 wherein the level difference is about 350 Angstroms.

14. The semiconductor structure of claim 11 wherein the second substrate has a thickness smaller than 200 nm.

15. The semiconductor structure of claim 11 wherein a ratio of the SOI area to the bulk area ranges from 1:5 to 1:2.

16. The semiconductor structure of claim 11 wherein the second substrate is a strained substrate.

17. The semiconductor structure of claim 11 wherein the insulation layer is a silicon-oxide-based material.

18. The semiconductor structure of claim 11 wherein the second substrate is made of a material based on Si, Ge or SiGeC alloy.

19. The semiconductor structure of claim 11 further comprising an isolation region on the first substrate for separating the SOI area from the bulk area.

20. A semiconductor structure that integrates at least one bulk device and at least one silicon-on-insulator (SOI) device, the semiconductor structure comprising:

a first substrate having an SOI area and a bulk area, on which the bulk device is formed;

an insulating layer formed on the first substrate in the SOI) area and a buried gate disposed under the insulation layer in the first substrate; and a second substrate, on which the SOI, device is formed, being stacked on the insulation layer, wherein a top surface of the first substrate and a top surface of the second substrate has a level difference smaller than 500 Angstroms.

* * * * *

UNITED STATES PATENT AND TRADEMARK OFFICE
CERTIFICATE OF CORRECTION

PATENT NO. : 7,105,897 B2 Page 1 of 1
APPLICATION NO. : 10/977236
DATED : September 12, 2006
INVENTOR(S) : Hao-Yu Chen et al.

It is certified that error appears in the above-identified patent and that said Letters Patent is hereby corrected as shown below:

Column 3, line 26, delete "one-embodiment" and insert therefore -- one embodiment -- .

Column 3, line 36, delete "In" and insert therefore -- in -- .

Column 5, lines 46 and 47, delete "pattem" and insert therefore -- pattern -- .

Column 6, line 21, delete "paint" and insert therefore -- point -- .

Column 6, lines 36-37, delete "incorparated" and insert therefore -- incorporated -- .

Column 6, line 55, delete "greedy" and insert therefore -- greatly -- .

Column 8, line 21, delete "8" and insert therefore -- a -- .

Column 10, line 1, delete "insulating" and insert therefore -- insulation -- .

Signed and Sealed this

Seventh Day of August, 2007

JON W. DUDAS
*Director of the United States Patent and Trademark Office*